US005454972A

United States Patent [19]

Williams et al.

[11] Patent Number: 5,454,972

[45] Date of Patent: Oct. 3, 1995

[54] AZEOTROPES OF OCTAMETHYLTRISILOXANE AND N-PROPOXYPROPANOL

[75] Inventors: Dwight E. Williams; Ora L. Flaningam, both of Midland, Mich.

[73] Assignee: Dow Corning Corporation, Midland, Mich.

[21] Appl. No.: 306,293

[22] Filed: Sep. 15, 1994

[51] Int. Cl.$^{6}$ .............................. C11D 7/26; C11D 7/50; B08B 3/08; H05K 3/26

[52] U.S. Cl. ......................... 252/174.15; 134/38; 134/39; 134/40; 252/162; 252/170; 252/171; 252/DIG. 9

[58] Field of Search .................................... 252/162, 170, 252/171, 174.15, DIG. 9; 134/38, 39, 40

[56] References Cited

U.S. PATENT DOCUMENTS

| | | | |
|---|---|---|---|
| 4,155,865 | 5/1979 | Ostrozynski | 252/67 |
| 4,157,976 | 6/1979 | Ostrozynski | 252/67 |
| 4,324,595 | 4/1982 | Kasprzak | 134/38 |
| 4,370,204 | 1/1983 | Kotzsch | 203/39 |
| 4,954,335 | 9/1990 | Janchipraponvej | 424/70 |
| 5,286,476 | 2/1994 | Nanba et al. | 424/70 |
| 5,316,692 | 5/1994 | John | 252/174.15 |

FOREIGN PATENT DOCUMENTS

| | | |
|---|---|---|
| 473795 | 3/1992 | European Pat. Off. . |
| 6093294 | 4/1994 | Japan . |
| 6-200294 | 7/1994 | Japan . |
| 6-313196 | 11/1994 | Japan . |
| WO93/14184 | 7/1993 | WIPO . |

OTHER PUBLICATIONS

Killgore et al, Journal of Chemical and Engineering Data, vol. 11 No. 4, pp. 535–537, 1966 no month available.

Guzman, Diss. Abstr. Intl. B, vol. 34 No. 5, pp. 2000B–2001B, 1973 no month available.

Radecki et al, Journal of Chemical and Engineering Data, vol. 20 No. 4, pp. 378–381, 1975 no month available.

Radecki et al, Inz. Chem., vol. 5 No. 4, p. 861+, 1975, no month available, English Abstract only.

Radecki et al, Journal of Chemical and Engineering Data, vol. 23 No. 2, pp. 148–150, 1978 no month available.

Radecki et al, Journal of Chemical and Engineering Data, vol. 25 No. 3, pp. 230–232, 1980 no month available.

Guzman et al, Fluid Phase Equilibria, No. 7, pp. 187–195, 1981 no month available.

Kaczmarek et al, Pol. J. Chem. 61 (1–3), pp. 267–271, 1987 no month available.

*Primary Examiner*—Linda Skaling Therkorn

*Attorney, Agent, or Firm*—James L. Decesare

[57] ABSTRACT

New binary azeotropes of octamethyltrisiloxane (MDM) with n-propoxypropanol, and the use of the binary azeotropes as environmentally friendly cleaning agents are disclosed. New azeotrope-like compositions of octamethyltrisiloxane and n-propoxypropanol are also disclosed.

13 Claims, No Drawings

AZEOTROPES OF OCTAMETHYLTRISILOXANE AND N-PROPOXYPROPANOL

BACKGROUND OF THE INVENTION

This invention is directed to an environmentally friendly cleaning agent, and more particularly to a cleaning agent which is a volatile methyl siloxane containing binary azeotrope.

Because of local, state, federal, and international regulations, aimed at restricting the use of certain chemicals, the search for suitable replacements is an ever increasing dilemma faced by the chemical and industrial sectors. The magnitude of the problem is exemplified below.

In the 1970s for instance, the US Environmental Protection Agency (EPA) named as criteria or "hazardous pollutants" sulfur dioxide $SO_2$; carbon monoxide CO; nitrogen dioxide $NO_2$; ozone $O_3$; suspended particulate with a diameter of ten microns (micrometers) or less $PM_{10}$; lead Pb; and nonmethane hydrocarbons (NMHC) now known as "volatile organic compounds" (VOC).

The most abundant species of photochemical smog is ozone. Ozone precursors are VOC, nitric oxide NO, and $NO_2$. In order to reduce ozone in a polluted atmosphere, reductions in VOC and nitrogen oxide $NO_x$ (NO and $NO_2$) precursors has been required.

Solar energy is absorbed by the surface of the earth and re-emitted as radiation. Certain gases in the atmosphere are capable of absorbing the re-emitted radiation and translating it into heat (THE GREENHOUSE EFFECT). The result is a higher atmospheric temperature (GLOBAL WARMING) than would be obtained in the absence of these "GREENHOUSE GASES". Accordingly, reductions in the emission of such gases has also been required, including carbon dioxide $CO_2$, methane $CH_4$, nitrous oxide $N_2O$, ozone, and a variety of chloro, fluoro, and chlorofluorocarbons (CFC) such as methylchloroform $CH_3CCl_3$ (MCF), carbon tetrachloride $CCl_4$, $C_2HF_5$ (HCFC-125), $C_2H_2F_4$ (HFC-134a), and chlorofluorocarbons such as $CFCl_3$ (CFC-11), $CF_2Cl_2$ (CFC-12), $C_2ClF_5$ (CFC-115), $CHClF_2$ (HCFC-22), $C_2HCl_2F_3$ (HCFC-123), $C_2HClF_4$ (HCFC-124), and $C_2Cl_3F_3$ (CFC-113).

Stratospheric ozone is a natural shield against the penetration of uv-light in the rays of the sun. There has been concern that any process which depletes stratospheric ozone will increase the amount of uv-B radiation (293–320 nanometers/2930–3200 angstroms) reaching the surface of the earth. Increased uv-B radiation may lead to the increased incidence of skin cancer. CFC's diffuse through the troposphere (up to 10 miles/16 kilometers) and into the mid-stratosphere (up to 30 miles/48 kilometers), where they are photolyzed by uv radiation and destroy ozone molecules. Because of STRATOSPHERIC OZONE DEPLETION, mandates such as the 1990 Clean Air Act Amendment contain a phaseout schedule for CFC's, halons (bromochlorofluorocarbons and bromofluorocarbons), carbon tetrachloride, and methylchloroform.

These are only a few of the problems faced by the chemical and industrial sectors in finding suitable replacements for such chemicals. Of particular interest according to the present invention, however, is the VOC aspect of the problem and the provision of a suitable substitute material. The solution to that problem is the object of the invention.

Thus, "volatile organic compounds" (VOC) and "volatile organic material" (VOM) are defined in the United States by Federal statute in Title 40 CFR 51.100(s) to be any compound of carbon, excluding carbon monoxide, carbon dioxide, carbonic acid, metallic carbides or carbonates, and ammonium carbonate, which participates in atmospheric photochemical reactions. The definition excludes certain compounds and classes of compounds as VOC or VOM.

Scientifically, VOC has been defined as any compound of carbon that has a vapor pressure greater than 0.1 millimeters of mercury (13.3 Pa) at a temperature of twenty degrees Centigrade and a pressure of 760 millimeters mercury (101.3 kPa); or if the vapor pressure is unknown, a compound with less than twelve carbon atoms. "Volatile organic content" is the amount of volatile organic compounds (VOC) as determined according to EPA Test Method 24 or 24A, the procedures of which are set forth in detail in Title 40 CFR Part 60, Appendix A.

Reduction of VOC has already been mandated in several states, and regulations in California for example, require less than about 180 grams of volatile material per liter of any product which enters the atmosphere. This amount can be determined by baking ten grams of a product in an oven at 110 degrees Centigrade for one hour. The amount of solids which remain is subtracted from the total of the ten grams which was tested. Calculations are based on the weight of the volatile that have evaporated, and the amount is reported as grams per liter.

The EPA has identified many volatile organic compounds (VOC) present in consumer products among which are such common solvents as ethanol, isopropyl alcohol, kerosene, and propylene glycol; and common hydrocarbon solvents such as isobutane, butane, and propane, which are often employed as propellants in various aerosol sprays.

The state of California under the auspices of the California Air Regulation Board (CARB), has proposed standards which would limit and reduce the amount of volatile organic compounds (VOC) permitted in various chemically formulated products used by household and institutional consumers. These regulations cover products such as detergents; cleaning compounds; polishes; floor products; cosmetics; personal care products; home, lawn and garden products; disinfectants; sanitizers; and automotive specialty products.

These CARB type standards would effect such widely used common consumer products such as shaving lather, hair spray, shampoos, colognes, perfumes, aftershave lotions, deodorants, antiperspirants, suntan preparations, breath fresheners, and room deodorants.

Replacement of "outlawed" chemicals with certain volatile methyl siloxanes (VMS) as a solvent substitute is a viable approach. In fact, the EPA in Volume 59, No. 53, of the Federal Register, 13044–13161, (Mar. 18, 1994), has indicated at Page 13091 that "Cyclic and linear volatile methyl siloxanes (VMSs) are currently undergoing investigation for use as substitutes for Class I compounds in metals, electronic and precision cleaning. Because of their chemical properties, these compounds show promise as substitutes for cleaning precision guidance equipment in the defense and aerospace industries. In addition, the volatile methyl siloxanes have high purity and are therefore relatively easy to recover and recycle. In the cleaning system using VMSs, the fluids are used to clean parts in a closed header system using a totally enclosed process. The parts are drained and then dried using vacuum baking".

At Pages 13093–13094, the EPA goes on to state that the "volatile methyl siloxanes dodecamethylcyclohexasiloxane, hexamethyldisiloxane, octamethyltrisiloxane, and decamethyltetrasiloxane are acceptable substitutes for CFC-113 and MCF" for cleaning in closed systems, in the metals cleaning sector, the electronics cleaning sector, and the precision cleaning sector; under the EPA Significant New Alternatives Policy (SNAP).

At Page 13137, the EPA notes that with regard to the two volatile methyl siloxanes octamethylcyclotetrasiloxane and decamethylcyclopentasiloxane, the "Agency has completed review of data, and intends under separate rule-making to propose these chemicals as acceptable with the use condition that the company-set exposure limits must be met".

In addition, a petition to the EPA filed in late 1992 is pending seeking exemption of these volatile methyl siloxanes (VMS) from regulation as VOC. The basis for the petition is that the volatile methyl siloxanes do not contribute to, and in some cases actually inhibit the formation of tropospheric ozone. Thus, the volatile methyl siloxanes have a lower ozone formation potential than ethane, which is the most reactive compound on a list of "exempt" VOC.

Furthermore, these volatile methyl siloxanes (VMS) have an atmospheric lifetime of between 10 to 30 days. As a consequence, VMS compounds do not contribute significantly to global warming. Volatile methyl siloxanes have no potential to deplete stratospheric ozone due to their short atmospheric lifetimes so that they will not rise and accumulate in the stratosphere. VMS compounds also contain no chlorine or bromine atoms.

Volatile methyl siloxane compounds (VMS) neither attack the ozone layer nor do they contribute to tropospheric ozone formation (Smog), and they have minimum GLOBAL WARMING potential. Volatile methyl siloxane compounds are hence unique in simultaneously possessing these three attributes.

Thus, it should be apparent that volatile methyl siloxanes provide a viable solution to the problem of finding a suitable replacement for "outlawed" chemicals heretofore commonly used as cleaning agents.

SUMMARY OF THE INVENTION

The invention relates to new binary azeotropes of a volatile methyl siloxane with an alcohol. The invention also relates to the use of these new siloxane containing azeotropes as an environmentally friendly cleaning agent.

As cleaning agents, the new azeotropes can be used to remove contaminants from any surface, but are particularly useful in applications related to defluxing and precision cleaning; low-pressure vapor degreasing; and vapor phase cleaning; for example.

The unexpected advantages and benefits of these new siloxane containing azeotropes as cleaning agents include enhanced solvency power, and the maintenance of a constant solvency power following evaporation, which may occur during applications involving vapor phase cleaning, distillative regeneration, and wipe cleaning.

Because the cleaning agent according to the invention is an azeotrope, it possesses the added advantage and benefit of being more easily recovered and recirculated. Thus, the azeotrope can be separated from the contaminated cleaning bath effluent after its use in the cleaning process. By simple distillation, its regeneration is facilitated whereby it may be recirculated in the system as fresh cleaning agent influent.

In addition, these azeotropes provide an unexpected advantage in being higher in siloxane fluid content and correspondingly lower in alcohol content, than azeotropes of siloxane fluids and lower molecular weight alcohols such as ethanol. The surprising result is that the azeotropes of the invention are less inclined to generate tropospheric ozone and smog.

In an alternate embodiment of the invention, certain azeotrope-like compositions were discovered which contain octamethyltrisiloxane and n-propoxypropanol.

These and other features, objects, and advantages, of the present invention will become more apparent from a consideration of the following detailed description thereof.

DETAILED DESCRIPTION OF THE INVENTION

An azeotrope is a mixture of two or more liquids, the composition of which does not change upon distillation. For example, a mixture of 95% ethanol and 5% water boils at a lower temperature of 78.15° Centigrade, than either pure ethanol which boils at a temperature of 78.3° Centigrade, or pure water which boils at a temperature of 100° Centigrade. Such liquid mixtures behave like a single substance in that the vapor produced by partial evaporation of liquid has the same composition as the liquid. Thus, these mixtures distill at a constant temperature without change in their composition and cannot be separated by normal distillation procedures.

Azeotropes exist in systems containing two liquids (A and B) termed binary azeotropes, in systems containing three liquids (A, B, and C) termed ternary azeotropes, and in systems containing four liquids (A, B, C, and D) termed quaternary azeotropes. The azeotropes of this invention are binary azeotropes.

However, as is well known in the art, azeotropism is an "unpredictable phenomenon", and each azeotropic composition must be discovered. The phenomenon of "unpredictability" is documented in the prior art, and U.S. Pat. No. 4157976 (Column 1 lines 47–51), is one example. Reference may also be had to U.S. Pat. No. 4155865 for further supporting documentation.

For purposes of this invention, a mixture of two or more components is azeotropic, if it vaporizes with no change in the composition of the vapor from the liquid. Specifically, azeotropic mixtures include both mixtures that boil without changing composition, and mixtures that evaporate at a temperature below the boiling point without changing composition. Accordingly, an azeotropic mixture may include mixtures of two components over a range of proportions where each specific proportion of the two components is azeotropic at a certain temperature, but not necessarily at other temperatures.

Azeotropes vaporize with no change in their composition. If the applied pressure is above the vapor pressure of the azeotrope, the azeotrope evaporates without change. If the applied pressure is below the vapor pressure of the azeotrope, the azeotrope boils or distills without change. The vapor pressure of low boiling azeotropes is higher, and the boiling point is lower than that of the individual components. In fact, the azeotropic composition has the lowest boiling point of any composition of its components. Thus, the azeotrope can be obtained by distillation of a mixture whose composition initially departs from that of the azeotrope.

Since only certain combinations of components can form azeotropes, the formation of an azeotrope cannot be reliably predicted without experimental vapor-liquid-equilibria (VLE) data, that is vapor and liquid compositions at constant total pressure or temperature for various mixtures of the components.

The composition of some azeotropes is invariant to temperature, but in many cases, however, the azeotropic composition shifts with temperature. The azeotropic composition as a function of temperature can be determined from high quality VLE data at a given temperature. Commercial software is available to make such determinations. The ASPENPLUS® program of Aspen Technology, Inc., of Cambridge, Mass., is an example of such a program. Given experimental data, such programs can calculate parameters from which complete tables of composition and vapor pressure may be generated. This allows a user of the system to determine where an azeotropic composition is located.

The volatile methyl siloxane used to form the azeotropes of the present invention, is a linear short chain siloxane fluid known as octamethyltrisiloxane, which has the formula $(CH_3)_3SiO(CH_3)_2SiOSi(CH_3)_3$. Octamethyltrisiloxane has a viscosity of 1.0 centistoke ($mm^2/s$) measured at 25° Centigrade. Octamethyltrisiloxane is sometimes referred to in the literature as "MDM". This shorthand notation indicates the presence in the molecule of one difunctional "D" unit $(CH_3)_2SiO_{2/2}$ and two monofunctional "M" units $(CH_3)_3SiO_{1/2}$, as is shown below.

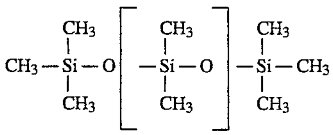

Octamethyltrisiloxane (MDM) is a clear fluid, essentially odorless, nontoxic, nongreasy, nonstinging, and it is nonirritating to skin. It will leave substantially no residue after thirty minutes at room temperature, when one gram of the fluid is placed at the center of No. 1 circular filter paper, with a diameter of 185 millimeters and supported at its perimeter in open room atmosphere.

In an original prior copending U.S. patent application Ser. No. 08/260,423, filed Jun. 15, 1994, we describe binary azeotropes of hexamethyldisiloxane with the 3-methyl-3-pentanol, 2-pentanol, and 1-methoxy-2-propanol. In a second prior copending U.S. patent application Ser. No. 08/289,360, filed Aug. 11, 1994, we describe binary azeotropes of several some new alcohols and an ester, that form azeotropes with octamethyltrisiloxane instead of hexamethyldisiloxane. In the second application, the alcohols are 2-methyl-1-pentanol; 1-hexanol; and the alkoxy containing aliphatic alcohol 1-butoxy-2-propanol. The ester in the second application is ethyl lactate.

The binary azeotropes according to this invention also include octamethyltrisiloxane, but we have unexpectedly and unpredictably found that octamethyltrisiloxane will form azeotropes with a different alcohol.

The alcohol in the azeotropes according to this invention is another alkoxy containing aliphatic alcohol n-propoxypropanol (1-propoxy-2-propanol) with the formula $C_3H_7OCH_2CH(CH_3)OH$. This alcohol is commercially available as is sold as a product by The Dow Chemical Company, Midland, Mich., USA, as propylene glycol n-propyl ether under The Dow Chemical Company trademark DOWANOL® PnP.

The boiling point of the two liquids in degrees Centigrade measured at the standard barometric pressure of 760 millimeters of mercury (101.3 kPa) is 152.6° for octamethyltrisiloxane; and 49.8° for n-propoxypropanol.

An especially significant, surprising, and unexpected result flowing from the use of the azeotropes of the invention, is that they possess an enhanced solvency power in comparison to the use of octamethyltrisiloxane alone. Yet at the same time, the azeotropes exhibit a mild solvency power making them useful for cleaning delicate surfaces without doing harm to the surface being cleaned.

The following examples are set forth for the purpose of illustrating the invention in more detail. New homogeneous binary azeotropes of octamethyltrisiloxane were discovered which contain 9 to 27 percent by weight of n-propoxypropanol and 73 to 91 percent by weight of octamethyltrisiloxane.

The azeotropes were homogeneous in that they had a single liquid phase at both the azeotropic temperature and also at room temperature. Homogeneous azeotropes are more desirable than heterogeneous azeotropes, especially for cleaning applications, because homogeneous azeotropes exist as one liquid phase instead of two phases as the heterogeneous azeotrope. Each phase of a heterogeneous azeotrope differs in its cleaning power. Therefore the cleaning performance of a heterogeneous azeotrope will be difficult to reproduce because it is dependent upon consistent mixing of the phases. Single phase (homogeneous) azeotropes are also more useful than multi-phase (heterogeneous) azeotropes, since they can be transferred between locations with more facility.

Each homogeneous azeotrope was found to exist over a particular temperature range. Within that range, the azeotropic composition shifted somewhat with temperature. The compositions were azeotropic within the range of zero to 148 degrees Centigrade inclusive.

EXAMPLE I

There was employed a single-plate distillation apparatus for measuring vapor-liquid equilibria. The liquid mixture was boiled and the vapor condensed into a small receiver which had an overflow path to recirculate back to the boiling liquid. When equilibrium was established, samples of the boiling liquid and of the condensed vapor were separately removed and quantitatively analyzed by gas chromatography (GC). The measured temperature, ambient pressure, and the liquid and vapor compositions, were obtained at several different initial compositional points. These data were used to determine whether an azeotropic composition existed. The azeotropic composition at different temperatures was determined by using the same data with the assistance of the ASPENPLUS® software program to perform the quantitative determinations. The azeotropic compositions are shown in Table I.

In Table I, "MDM" is used to designate the weight percent in the azeotropic composition of octamethyltrisiloxane. The vapor pressure VP in Table I is shown in Torr pressure units (1 Torr= 0.133 kPa/1 mmHg). The accuracy in determining the azeotropic compositions is approximately plus or minus about two weight percent.

TABLE I

| ALCOHOL | TEMPERATURE °C. | VP (Torr) | WEIGHT % MDM |
|---|---|---|---|
| n-propoxypropanol | 147.9 | 1000 | 73 |
| | 138.6 | 760 | 74 |
| | 125 | 493.3 | 76 |
| | 100 | 203 | 79 |
| | 75 | 71.7 | 82 |
| | 50 | 20.9 | 86 |
| | 25 | 4.7 | 88 |
| | 0 | 0.8 | 91 |

The azeotropic compositions of the invention are particularly useful for cleaning precision articles made of metal, ceramic, glass, and plastic. Examples of such articles are electronic and semiconductor parts, electric and precision machinery parts such as ball bearings, optical parts and components such as lenses, photographic and camera parts and equipment, and military and space hardware such as precision guidance equipment used in the defense and aerospace industries.

One especially useful application of the azeotropic compositions of the invention is the cleaning and removal of fluxes used in mounting and soldering electronic parts on printed circuit boards. For example, a solder is often used in making a mechanical, electro-mechanical, or electronic connection. Thus, in making electronic connections, the components are attached to the conductor paths of a printed wiring assembly by wave soldering. The solder used is usually a tin-lead alloy, with the aid of a flux which is rosin based. Rosin is a complex mixture of isomeric acids principally abietic acid. These rosin fluxes often also contain activators such as amine hydrohalides and organic acids. The function of the flux is to react with and remove surface compounds such as oxides. It also reduces the surface tension of the molten solder alloy, and prevents oxidation during the heating cycle by providing a surface blanket to the base metal and solder alloy.

After the soldering operation, however, it is usually necessary to perform a final cleaning of the assembly. The azeotropic compositions of the invention are useful as a final cleaner. They remove any flux residues and oxides formed on areas unprotected by the flux during soldering which are corrosive or would cause malfunctioning or short circuiting of electronic assemblies. In such applications, the azeotropic compositions can be used as cold cleaners, vapor degreasers, or accompanied with ultrasonic energy.

The azeotropic compositions of this invention can also be used to remove carbonaceous materials from the surface of the above types of articles, as well as from the surface of various other industrial articles. Exemplary of carbonaceous materials are any carbon containing compound or mixtures of carbon containing compounds, which are soluble in one or more of the common organic solvents, such as hexane, toluene, or 1,1,1-trichloroethane.

For the purpose of further illustrating the invention, the use of the azeotropes for cleaning was tested using a rosin-based solder flux as the soil. The cleaning tests were at 22° Centigrade in an open bath with no distillative recycle of the azeotrope. All of the azeotropes were found to remove flux, although not each of the azeotropes was equally effective. For purposes of comparison, a CONTROL composition consisting of only octamethyltrisiloxane was included in these cleaning tests, and is shown in Table II as composition No. 3.

EXAMPLE II

Kester No. 1544 rosin flux was mixed with 0.05 weight percent of a nonreactive low viscosity silicone glycol flowout additive. The mixture was applied as a uniform thin layer to a 2"×3" (5.1×7.6 cm) area of an Aluminum Q panel with a No. 36 Industry Tech Inc. draw-down rod. An activated rosin-based solder flux commonly used for electrical and electronic assemblies was employed. The flux was a product manufactured and sold by Kester Solder Division, Litton Industries, Des Plaines, Ill., USA. The approximate composition of the flux was fifty weight percent of a modified rosin, twenty-five weight percent of ethanol, twenty-five weight percent of 2-butanol, and one weight percent of a proprietary activator. The coating was allowed to dry at room temperature and cured at 100° C. for ten minutes in an air oven. The Aluminum Q panel was placed in a large beaker which had a magnetic stirring bar at the bottom and one-third filled with the azeotropic composition. Cleaning was conducted while rapidly stirring at room temperature, even when cleaning with the higher temperature azeotropic compositions. The panel was removed at timed intervals, dried at 80° C. for ten minutes, weighed, and reimmersed for additional cleaning. The initial coating weight and the weight loss were measured as a function of cumulative cleaning time, and this data is shown in Table II.

In Table II, the alcohol n-propoxypropanol is abbreviated as "N-PR-P". The "WT. %" in the table refers to the weight percent of the alcohol. The "TEMP" is the azeotropic temperature in Centigrade degrees of the azeotrope. The "WT" is the initial weight of the coating in grams. The "Time" shown in Table II is cumulative time, as is measured at the elapse of one minute, five minutes, ten minutes, and thirty minutes.

As noted above, composition No. 3 in Table II was a CONTROL consisting of one hundred percent by weight of octamethyltrisiloxane (MDM). It should be apparent from Table II that the azeotropic compositions 1 and 2 were much more effective cleaners than the CONTROL composition No. 3.

TABLE II

| CLEANING EXTENT AT ROOM TEMPERATURE (22° C.) | | | | | % REMOVED (Time-min) | | | |
|---|---|---|---|---|---|---|---|---|
| No. | WT % | LIQUIDS | TEMP | WT | 1 | 5 | 10 | 30 |
| 1 | 24% | N-PR-P | 138.6 | 0.3327 | 75.0 | 99.6 | 99.6 | 99.6 |
| 2 | 12% | N-PR-P | 25.0 | 0.3101 | 76.3 | 85.3 | 87.2 | 89.4 |
| 3 | 0% | 100% MDM | — | 0.3460 | 0.7 | 1.5 | 1.9 | 3.2 |

These azeotropes have several advantages for cleaning, rinsing, or drying. Thus, the azeotropic composition can easily be regenerated by distillation so that the performance of the cleaning mixture can be restored after a period of use. The performance factors which can be affected by the composition of azeotropic mixtures include bath life, cleaning speed, lack of flammability when only one component is non-flammable, and lack of damage to sensitive parts.

In vapor phase degreasing equipment, the azeotropic mixture can be continually restored by continuous distillation at atmospheric or at reduced pressure, and can be continually recycled in the cleaning equipment. In this type of equipment, cleaning or rinsing can be conducted at the boiling point by plunging the part to be cleaned or rinsed in the boiling liquid, or by allowing the refluxing vapor to condense on the cold part. Alternatively, the part may be immersed in a cooler bath that is continually fed by fresh condensate, and the dirty overflow liquid is returned to a boil sump.

If the azeotrope is used in an open system, the composition and the performance of the azeotrope will remain constant even though evaporative losses occur. Such a system can be operated at room temperature when used in a ambient cleaning bath, or when used as a wipe-on-by-hand cleaner. The cleaning bath can also be operated at elevated temperatures which are below the boiling point, although often cleaning, rinsing, or drying, occurs faster at an elevated temperature, and hence is desirable when the part to be cleaned and the equipment permit.

The azeotropes of the invention can be used for cleaning in a variety of ways beyond those shown by the foregoing examples. Thus, cleaning can be conducted by using a given azeotrope at or near its azeotropic temperature or at some other temperature.

Other processes of use of the azeotropes of the invention include the distillative recycle of a spent azeotrope at atmospheric pressure, or at a reduced pressure. In addition, cleaning may be conducted by immersing the part to be cleaned in quiescent or boiling liquid, as well as in the vapor condensation region above the boiling liquid. In the later case, the part is cleaned in a continually renewed liquid of maximum cleaning power.

In cleaning applications according to the invention, only the azeotrope may be used, however if desired, small amounts of one or more organic liquid additives can be combined with the azeotrope. Organic liquid additives contemplated according to the invention, are compounds capable of imparting an enhanced oxidative stability, corrosion inhibition, or solvency enhancement.

Oxidative stabilizers inhibit the slow oxidation of organic compounds such as alcohols. Corrosion inhibitors inhibit metal corrosion by traces of acids that may be present, or which slowly form in alcohols. Solvency enhancers increase solvency power by adding more powerful solvents to a starting solvent. These additives can mitigate any undesired effects of the alcohol component of the new azeotropes of the invention, since the alcohol component is not as resistant to oxidative degradation as octamethyltrisiloxane.

Numerous additives are suitable for combination with the azeotropes of the invention, and octamethyltrisiloxane is miscible with small amounts of many such additives. However, regardless of the additive, it must be one in which the resulting liquid mixture of the selected additive and the azeotrope, is homogeneous and single phased.

Among the oxidative stabilizers that may be employed in amounts of about 0.05 to 5 percent by weight, are phenols such as trimethylphenol, cyclohexylphenol, thymol, 2,6-di-t-butyl-4-methylphenol, butylhydroxyanisole, and isoeugenol; amines such as hexylamine, pentylamine, dipropylamine, diisopropylamine, diisobutylamine, triethylamine, tributylamine, pyridine, N-methylmorpholine, cyclohexylamine, 2,2,6,6-tetramethylpiperidine, and N,N'-diallyl-p-phenylenediamine; and triazoles such as benzotriazole, 2-(2'-hydroxy-5'-methylphenyl)benzotriazole, and chlorobenzotriazole.

Among the corrosion inhibitors that may be employed in amounts of about 0.1 to 5 percent by weight, are aliphatic nitro compounds such as nitromethane, nitroethane, and nitropropane; acetylene alcohols such as 3-methyl-1-butene-3-ol, and 3-methyl-1-pentene-3-ol; epoxides such as glycidol, methyl glycidyl ether, allyl glycidyl ether, phenyl glycidyl ether, 1,2-butylene oxide, cyclohexene oxide, and epichlorohydrin; ethers such as dimethoxymethane, 1,2-dimethoxyethane, 1,4-dioxane, and 1,3,5-trioxane; unsaturated hydrocarbons such as hexene, heptene, octene, 2,4,4-trimethyl-1-pentene, pentadiene, octadiene, cyclohexene, and cyclopentene; olefin based alcohols such as allyl alcohol, and 1-butene-3-ol; and acrylic acid esters such as methyl acrylate, ethyl acrylate, and butyl acrylate.

Among the solvency enhancers that may be employed in amounts of about 0.1 to 10 percent by weight, are hydrocarbons such as pentane, isopentane, hexane, isohexane, and heptane; nitroalkanes such as nitromethane, nitroethane, and nitropropane; amines such as diethylamine, triethylamine, isopropylamine, butylamine, and isobutylamine; alcohols such as methanol, ethanol, n-propyl alcohol, isopropyl alcohol, n-butanol, and isobutanol; ethers such as methyl Cellosolve®, tetrahydrofuran, and 1,4-dioxane; ketones such as acetone, methyl ethyl ketone, and methyl butyl ketone; and esters such as ethyl acetate, propyl acetate, and butyl acetate.

As noted above, certain other azeotrope-like compositions were also discovered which contain octamethyltrisiloxane and n-propoxypropanol as components.

For purposes of the present invention, azeotrope-like is intended to mean a composition that behaves like an azeotrope. Thus, an azeotrope-like composition has constant boiling characteristics, or it has a tendency not to fractionate upon boiling or evaporation. In an azeotrope-like composition, the composition of the vapor which is formed during boiling or evaporation, is identical or substantially identical to the composition of the original liquid. Therefore, during boiling or evaporation, the liquid composition changes only minimally or to a negligible extent, if it changes at all. In contrast, the liquid composition of a non-azeotrope-like composition changes to a substantial degree during boiling or evaporation.

According to the invention, an azeotrope-like composition includes all ratios of the azeotropic components that boil within one Centigrade degree of the minimum boiling point at 760 Torr.

Azeotrope-like compositions of octamethyltrisiloxane and n-propoxypropanol were found to exist at 760 Torr vapor pressure, for all ratios of the two components where the weight percent of octamethyltrisiloxane varied between 54 to 91 percent. All azeotrope-like compositions had a normal boiling point that was within one Centigrade degree of the minimum value of 138.64° C.

The procedure employed for determining these azeotrope-like compositions was the same as the procedure outlined above in Example I. These azeotrope-like compositions contained octamethyltrisiloxane and n-propoxypropanol, and the compositions were homogeneous and azeotrope-like at a temperature that was within the range of 138.64 to 139.64 degrees Centigrade inclusive. These azeotrope-like compositions contained 9 to 46 percent by weight of n-propoxypropanol and 54 to 91 percent by weight of octamethyltrisiloxane. Such azeotrope-like compositions have the same utility as that explained above for the binary azeotropes.

Other variations and modifications may be made in the compounds, compositions, and methods described herein, without departing from the essential features and concepts of the present invention. The forms of the invention described herein are exemplary only, and are not intended as limitations on the scope of the invention as defined in the appended claims.

That which is claimed is:

1. A composition consisting essentially of about 9 to about 27 percent by weight n-propoxypropanol and about 73 to about 91 percent by weight octamethyltrisiloxane wherein the composition is homogenous and azeotropic at a temperature within the range of about 0 to about 148 degrees Centigrade inclusive and wherein the composition has a vapor pressure of 1000 Torr at about 148 degrees Centigrade when the composition consists essentially of 73 percent by weight octamethyltrisiloxane and 27 percent by weight n-propoxypropanol and wherein the composition has a vapor pressure of 0.8 Torr at 0 degrees Centigrade when the composition consists essentially of 91 percent by weight octamethyltrisiloxane and 9 percent by weight n-propoxypropanol.

2. A composition according to claim 1 consisting essentially of containing 27 percent by weight of n-propoxypropanol and 73 percent by weight of octamethyltrisiloxane.

3. A composition according to claim 1 consisting essentially of containing 26 percent by weight of n-propoxypropanol and 74 percent by weight of octamethyltrisiloxane.

4. A composition according to claim 1 consisting essentially of containing 24 percent by weight of n-propoxypropanol and 76 percent by weight of octamethyltrisiloxane.

5. A composition according to claim 1 consisting essentially of containing 21 percent by weight of n-propoxypropanol and 79 percent by weight of octamethyltrisiloxane.

6. A composition according to claim 1 consisting essentially of containing 18 percent by weight of n-propoxypropanol and 82 percent by weight of octamethyltrisiloxane.

7. A composition according to claim 1 consisting essentially of containing 14 percent by weight of n-propoxypropanol and 86 percent by weight of octamethyltrisiloxane.

8. A composition according to claim 1 consisting essentially of containing 12 percent by weight of n-propoxypropanol and 88 percent by weight of octamethyltrisiloxane.

9. A composition according to claim 1 consisting essentially of containing 9 percent by weight of n-propoxypropanol and 91 percent by weight of octamethyltrisiloxane.

10. A method of cleaning material from the surface of an article comprising applying to the surface a cleaning agent which is a composition as defined in accordance with claim 1.

11. The method according to claim 10 in which the article is an electronic circuit board or an article made of a material selected from the group consisting of metal, ceramic, glass, and plastic.

12. The method according to claim 11 in which material cleaned from the surface is selected from the group consisting of carbonaceous materials and solder fluxes.

13. A composition consisting essentially of 54 to 91 percent by weight octamethyltrisiloxane and 9 to 46 percent by weight n-propoxypropanol wherein the composition is homogeneous and azeotrope-like at a temperature in the range of 138.63 to 139.64 degrees Centigrade at 760 Torr.

* * * * *